United States Patent
Wagenleitner

(10) Patent No.: US 11,121,091 B2
(45) Date of Patent: Sep. 14, 2021

(54) METHOD FOR ARRANGING TWO SUBSTRATES

(71) Applicant: EV Group E. Thallner GmbH, St. Florian am Inn (AT)

(72) Inventor: Thomas Wagenleitner, Aurolzmunster (AT)

(73) Assignee: EV Group E. Thallner GmbH, St. Florian am Inn (AT)

( * ) Notice: Subject to any disclaimer, the term of this patent is extended or adjusted under 35 U.S.C. 154(b) by 0 days.

(21) Appl. No.: 16/487,647

(22) PCT Filed: Mar. 20, 2017

(86) PCT No.: PCT/EP2017/056584
§ 371 (c)(1),
(2) Date: Aug. 21, 2019

(87) PCT Pub. No.: WO2018/171861
PCT Pub. Date: Sep. 27, 2018

(65) Prior Publication Data
US 2019/0378799 A1    Dec. 12, 2019

(51) Int. Cl.
*H01L 23/544* (2006.01)
*H01L 21/68* (2006.01)
*H05K 13/00* (2006.01)

(52) U.S. Cl.
CPC .......... *H01L 23/544* (2013.01); *H01L 21/681* (2013.01); *H01L 2223/54426* (2013.01); *H01L 2223/54493* (2013.01); *H01L 2224/8013* (2013.01); *H01L 2224/80121* (2013.01); *H05K 13/0015* (2013.01)

(58) Field of Classification Search
CPC ..... H01L 23/544; H01L 21/68; H01L 21/681; H01L 2224/8012; H01L 2224/8112; H01L 2224/80121; H01L 2224/8013; H05K 13/0015
See application file for complete search history.

(56) References Cited

U.S. PATENT DOCUMENTS

| | | | |
|---|---|---|---|
| 6,214,692 B1 | 4/2001 | Thallner | |
| 7,122,912 B2 * | 10/2006 | Matsui | H01L 25/50 257/797 |
| 8,102,064 B2 * | 1/2012 | Renn | H01L 23/544 257/797 |

(Continued)

FOREIGN PATENT DOCUMENTS

| | | | |
|---|---|---|---|
| WO | WO 2010/023935 A1 | 3/2010 | |
| WO | WO 2011/042093 A1 | 4/2011 | |

(Continued)

OTHER PUBLICATIONS

International Search Report from corresponding International Patent Application No. PCT/EP2017/056584, dated Dec. 1, 2017.

(Continued)

*Primary Examiner* — David A Zarneke
(74) *Attorney, Agent, or Firm* — Kusner & Jaffe

(57) ABSTRACT

A method and device for the alignment of substrates that are to be bonded. The method includes detecting and storing positions of alignment mark pairs located on surfaces of the substrates, and aligning the substrates with respect to each other in accordance with the detected positions.

11 Claims, 6 Drawing Sheets

(56) References Cited

U.S. PATENT DOCUMENTS

| | | | |
|---|---|---|---|
| 8,569,899 B2* | 10/2013 | Zhang | H01L 22/22 |
| | | | 257/797 |
| 9,274,633 B2* | 3/2016 | Misaki | G06F 3/041 |
| 10,679,948 B2* | 6/2020 | Ogawa | G03F 9/7076 |
| 2012/0255365 A1 | 10/2012 | Wimplinger | |
| 2015/0083786 A1 | 3/2015 | Okamoto et al. | |

FOREIGN PATENT DOCUMENTS

| WO | WO 2014/202106 A1 | 12/2014 |
|---|---|---|
| WO | WO 2015/082020 A1 | 6/2015 |
| WO | WO 2015/113641 A1 | 8/2015 |

OTHER PUBLICATIONS

Matthias et al., "Aligned wafer bonding for 3D interconnect and wafer-level layer transfer process," Proceedings 2005 International Symposium on Microelectronics, Philadelphia, Pennsylvania, Sep. 25-29, 2005, pp. 6-16.

* cited by examiner

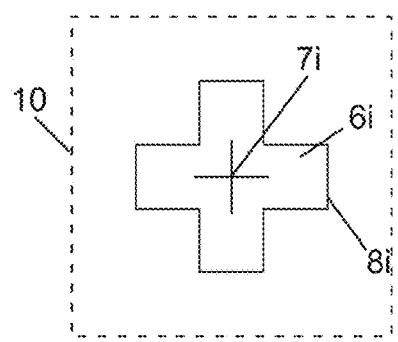
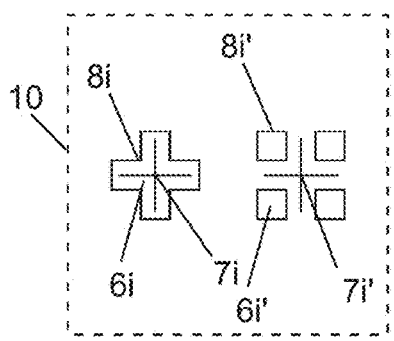
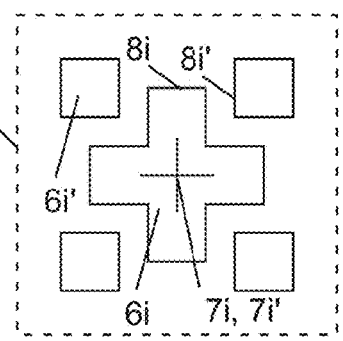
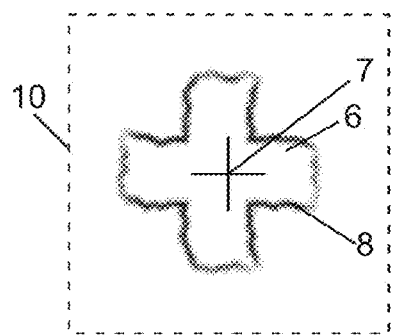
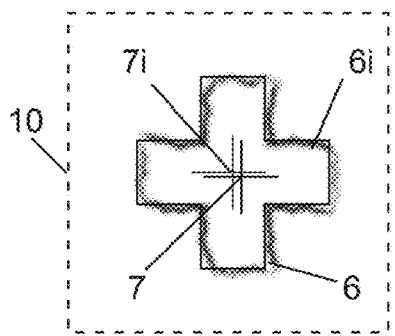

METHOD FOR ARRANGING TWO SUBSTRATES

FIELD OF THE INVENTION

The present invention relates generally to a method and apparatus for substrate alignment.

BACKGROUND OF THE INVENTION

Substrates are orientated with respect to one another with the aid of alignment systems according to the prior art. Alignment marks, which are aligned with respect to one another by means of the alignment systems, are located on the substrates. The prior art recognises numerous methods for measuring the alignment marks, for the correct positioning of the substrates on which the alignment marks are located and for the subsequent bonding step.

The major problem with the measurement of alignment marks is that the alignment marks themselves are never perfect. They are distorted, have a rough surface, poorly produced edges etc. The contrast or optical effects are very often decisively responsible for the fact that the lens systems and the cameras are not capable of obtaining an optimum image of the alignment mark. Since the alignment marks are recognised and measured by means of software, the accuracy of the position determination of the alignment mark is essentially dependent on their quality. The quality of the alignment mark cannot however be raised arbitrarily, so that it must be assumed that non-perfect alignment marks have to be measured.

A further problem in the prior art is that minimal deviations from the setpoint position of the alignment marks can arise. Although the positions of the alignment marks are defined with the greatest possible accuracy in the computer, the production of the alignment marks is however limited by the accuracy of the processes and equipment which generate the alignment marks on the substrate surface. Even if the alignment marks were to have no deviation from their ideal geometry, their real position can diverge minimally from the ideal position. The alignment mark deviation lies approximately between 1-100 nm. i.e. in the nanometre range.

SUMMARY OF THE INVENTION

It is an object of the present invention to provide a method with which the accuracy of the alignment of two substrates with respect to one another can be improved.

This problem is solved with the features of the coordinated claims. Advantageous developments of the invention are given in the sub-claims.

All combinations of at least two features given in the description, the claims and/or the drawings also fall within the scope of the invention. In value ranges, values lying inside the stated limits are also deemed to be disclosed as limiting values and can be claimed in any combination.

An invention is proposed for the alignment of two substrates to be bonded, wherein the first substrate comprises a first substrate surface with a first substrate surface side (also referred to hereinafter as the left-hand substrate surface side) and a second substrate surface side (also referred to hereinafter as the right-hand substrate surface side) which lies opposite the first substrate surface side, wherein the second substrate comprises a second substrate surface to be bonded with the first substrate surface, wherein the second substrate surface comprises a third substrate surface side (also referred to hereinafter as the left-hand substrate surface side) and a fourth substrate surface side which lies opposite the third substrate surface side (also referred to hereinafter as the right-hand substrate surface side), wherein the method comprises at least the following steps:

detection and storage of first positions of a first alignment mark pair on the first substrate surface of the first substrate, wherein a first alignment mark of the first alignment mark pair is arranged on the first substrate surface side and a second alignment mark of the first alignment mark pair is arranged on the second substrate surface side, detection and storage of second positions of a second alignment mark pair on the second substrate surface of the second substrate, wherein a third alignment mark of the second alignment mark pair is arranged on the third substrate surface side and a fourth alignment mark of the second alignment mark pair is arranged on the fourth substrate surface side, detection and storage of third positions of a third alignment mark pair on the second substrate surface of the second substrate, wherein a fifth alignment mark of the third alignment mark pair is arranged on the third substrate surface side and a sixth alignment mark of the third alignment mark pair is arranged on the fourth substrate surface side, detection and storage of fourth positions of a fourth alignment mark pair on the first substrate, wherein a seventh alignment mark of the fourth alignment mark pair is arranged on the first substrate surface side and an eighth alignment mark of the fourth alignment mark pair is arranged on the second substrate surface side, alignment of the two substrates with respect to one another depending on the detected first positions, second positions, third positions and fourth positions.

The method preferably comprises the following steps, in particular the following sequence:

arrangement and fixing of the substrates on substrate holders, movement of the first substrate holder with the first substrate into a first detection position, detection and storage of the first positions of the first alignment mark pair on the first substrate surface of the first substrate in the first detection position, wherein the first alignment mark of the first alignment mark pair is arranged on the first substrate surface side and the second alignment mark of the first alignment mark pair is arranged on the second substrate surface side, movement of the second substrate holder with the second substrate into a second detection position and, in particular simultaneous, movement of the first substrate holder with the first substrate into a first waiting position, detection and storage of second positions of the second alignment mark pair on the second substrate surface of the second substrate in the second detection position, wherein the third alignment mark of the second alignment mark pair is arranged on the third substrate surface side and the fourth alignment mark of the second alignment mark pair is arranged on the fourth substrate surface side, detection and storage of the third positions of the third alignment mark pair on the second substrate surface of the second substrate in the second detection position of the second substrate holder, wherein the fifth alignment mark of the third alignment mark pair is arranged on the third substrate surface side and the sixth alignment mark of the third alignment mark pair is arranged on the fourth substrate surface side, movement of the first substrate holder with the first substrate into the first detection position and, in particular simultaneous, movement of the second substrate holder with the second substrate into a second waiting position, detection and storage of the fourth positions of the fourth alignment mark pair on the first substrate in the first detection position, wherein the seventh alignment mark of the fourth alignment mark pair is arranged on the first substrate surface side and the eighth alignment mark of the fourth alignment mark pair is arranged on the second substrate surface side, alignment of the two substrates with respect to one another depending on the detected first positions, second positions, third positions and fourth positions.

In a preferred embodiment, provision is made such that the positions of at least two alignment marks, preferably of at least three alignment marks, still more preferably of at least four alignment marks, most preferably of at least five alignment marks, with utmost preference of at least six alignment marks are detected per substrate surface side on the substrates. The accuracy of the alignment can thus be advantageously improved.

In a preferred embodiment, provision is made such that the alignment marks of a substrate surface side are arranged inside a circle K with a radius less than 100 mm, preferably less than 50 mm, still more preferably less than 25 mm, most preferably less than 10 mm, with utmost preference less than 1 mm. The travel path of the lens system for detecting the alignment marks can thus be minimised, so that only minimal errors arise due to the movement of the lens system. The lens system for the detection preferably does not have to be moved.

In a much preferred embodiment according to the invention, a plurality of, in particular even all of the alignment marks of the same substrate surface side are located in the field of view of a lens system.

In another preferred embodiment according to the invention, a plurality of, in particular all of the alignment marks of the same substrate surface side are located in the field of view of a lens system, and are centred with respect to one another. For this purpose, it is necessary for the alignment marks to become increasingly large from the centre outwards and not to overlap.

In the particularly preferred embodiments according to the invention, in which a plurality of alignment marks are located in the field of view of the lens systems, it is of particular interest that the alignment marks are located as far as possible at the edge of the substrate in order to increase the alignment accuracy. The alignment marks are then located less than 30 mm, preferably less than 20 mm, still more preferably less than 10 mm, most preferably less than 5 mm, with utmost preference less than 1 mm from the edge of the substrate.

In a preferred embodiment, provision is made such that the positions of the alignment marks are detected optically. Advantageously, a comparatively accurate position determination is thus possible.

In a preferred embodiment, provision is made such that the positions of the substrate holders are detected by interferometers and/or lens systems, which in particular are independent of the detection devices for detecting the positions of the alignment marks. The position determination of the substrate holders can thus be advantageously improved.

The positions of the lens systems can also be determined by detection devices, in particular by interferometers.

In a preferred embodiment, provision is made such that the substrate holders are fixed in the detection positions. Advantageously, the position of the substrate holders can thus be better determined.

The present invention also relates to a device for the alignment of two substrates to be bonded with a method comprising:
  substrate holders for holding and fixing the substrates,
  movement devices for moving the substrate holders,
  lens systems for detecting positions of alignment marks on the substrates,
  a storage device for storing the positions of the alignment marks.

The features concerning the method also relate analogously to the device according to the invention.

The present invention also relates to a product with two substrates, comprising at least two alignment marks on each side.

According to an aspect of the present invention, there is a demonstration of a statistical method, with the aid of which two substrates can be better aligned in respect of the alignment marks and bonded together, whereby recourse is taken to determining a plurality of alignment marks which are located at different positions, in particular at a differing radial distance from the centre of the substrate.

The problem of substrate alignment is improved in particular by the fact that it is not the alignment marks themselves, but rather statistically averaged positions, which can be calculated from a plurality of alignment marks, that are used to align the substrates with respect to one another.

The invention advantageously permits the alignment of two substrates with a high degree of precision even if the alignment marks have not been ideally created with regard to their form and/or position and/or alignment. The alignment accuracy that can be achieved is primarily also dependent on the number of alignment marks used for the alignment process. As a result of using a plurality of alignment marks, in particular those of lower quality, quality deficiencies are averaged out from the final result. For an alignment process which relies on taking the average of a plurality of alignment marks, it is particularly advantageous if all the marks of one side are simultaneously located in the field of view of a lens system.

If errors which can be traced back to local and/or global curvatures of the substrate are to be corrected by the process according to the invention, a concentrated production of alignment marks in a region which can be covered by the field of view of the lens system is more of a hindrance. The alignment accuracy would then increase by the inventive measurement of a plurality of alignment marks which are farther away from one another.

According to the invention, a corresponding solution is preferred depending on the given problem. If it is known that the matching marks are produced with inferior quality, the latter are preferably produced close to one another. If a higher alignment accuracy for a severely distorted and/or curved substrate is to be achieved by means of the alignment marks, the alignment marks on each substrate side are farther away from one another. The aforementioned possibility of statistical error determination can thus be applied to both the known methods.

In a particularly preferred embodiment according to the invention, it is conceivable that there is a plurality of regions with in each case a plurality of alignment marks, each individual region whereof can be completely covered by the field of view of the lens systems. According to the invention, therefore, all the alignment marks of a region are used to compensate for quality deficiencies in the alignment marks, while the alignment marks of different regions can be used to improve the alignment accuracy with regard to curvatures.

Substrates and Alignment Marks

The substrates comprise a first substrate surface and a second substrate surface which lies opposite the first substrate surface. The substrate surface which is part of the bond interface is called the inner substrate surface, the substrate surface which lies opposite the inner substrate surface is called the outer substrate surface.

In the subsequent text of the present disclosure, the inner substrate surfaces alone are of importance. Unless mentioned otherwise, all the substrate surfaces mentioned in the present disclosure are inner substrate surfaces.

The substrate surface comprises a left-hand substrate surface side and a right-hand substrate surface side. The left-hand substrate surface side comprises the entire area of the substrate surface on the left of a plane which lies normal to the substrate surface and preferably runs through the notch and the substrate centre, or preferably lies normal to the flat side of the substrate and runs through the substrate centre. The right-hand substrate surface side comprises the entire area of the substrate surface to the right of the plane which preferably lies normal to the substrate surface and runs through the notch, or preferably lies normal to the flat side of the substrate.

For the sake of completeness, it is mentioned that the plane does not necessarily have to run through the notch or lie normal to the flat side. Symmetry considerations, however, usually mean that such substrates, in particular the functional units on the substrates, are symmetrical with respect to a plane which runs through the notch or lies normal to the flat side. Corresponding to the symmetrical distribution of the functional units on the substrate surface, the alignment marks are then also distributed symmetrically.

The substrates to be aligned according to the invention comprise at least two alignment marks per substrate surface side. More than two alignment marks, in particular more than 3 alignment marks, still more preferably more than 4 alignment marks, most preferably more than 5 alignment marks, with utmost preference more than 6 alignment marks per substrate surface side are conceivable. The alignment marks of a substrate surface side are preferably located inside a circle K with a radius less than 100 mm, preferably less than 50 mm, still more preferably less than 25 mm, most preferably less than 10 mm, with utmost preference less than 1 mm.

In a very particularly preferred embodiment, the alignment marks of a substrate surface side are located on the same radius of the substrate. In a very particularly preferred embodiment according to the invention, all the alignment marks of both substrate surface sides are located on the same diameter of the substrate.

A further classification of the substrate marks is made via their position relative to the centre of the substrate. The alignment marks which lie closest to the centre of the substrate are referred to as inner alignment marks. The alignment marks which lie farthest away from the centre are referred to as outer alignment marks. In order to keep the process according to the invention as simple as possible in the description, mention will only be made of two alignment marks per substrate surface side in the subsequent text. An extension of the embodiment according to the invention to more than two alignment marks or an extension of the embodiment according to the invention to a repeated measurement of the same alignment marks per substrate surface side is then made on the basis of analogy considerations. An extension of the embodiment according to the invention to more than two alignment marks or an extension of the embodiment according to the invention to a repeated measurement of the same alignment marks per substrate surface side is also disclosed graphically by the loop in the shown flow diagram.

Calibration Process

Before the actual process according to the invention, a calibration of the lens systems of the alignment arrangement takes place. Corresponding systems for the alignment of substrates are disclosed in publications U.S. Pat. No. 6,214,692B1, PCT/EP2013/075831, WO2011042093A1 and WO2014202106A1 and will not therefore be described in detail here.

The system according to the invention comprises at least four lens systems, which are preferably grouped to form two optical groups in each case. Each lens system of a optical group can be moved individually, in particular moved in a translational manner and/or rotated, but after the calibration it is fixed with respect to the lens system lying opposite in each case. As a result of a translational and/or rotational movement of the optical group, therefore, both lens systems thus move simultaneously after the fixing. This rigid fixing of the lens systems with respect to one another is preferably no longer removed after the respective calibration process, which is explained in greater detail in the following section.

The calibration of the lens systems of a optical group is aimed at establishing the point of intersection of the optical axes. The depth of field at the same time contains the region of the subsequent focus planes.

The lens systems are calibrated to the alignment marks. The alignment mark is preferably located in a, in particular transparent, calibration substrate. However, alignment marks can also be used which are located on the surface of the calibration substrate.

In a first calibration step, the first lens system of the first optical group of a first side is focused on a first alignment mark. The lens system is preferably calibrated such that the first alignment mark is located in the centre of the depth of field.

In a second calibration step, the second lens system of the first optical group of the first side is focused on the same, first alignment mark. The lens system is preferably calibrated such that the first alignment mark is located in the centre of the depth of field. In particular, the lens system travels in the x- and/or y- and/or z-direction or performs a rotation about the x- and/or y- and/or z-axis. The alignment mark is preferably located precisely in the centre of the field of view after the calibration process.

Generally, the optical axes of the two first lens systems do not lie normal to the focusing plane. The optical axes thus preferably intersect in the first alignment mark. After this calibration step, the two lens systems of the first optical group are no longer moved with respect to one another.

In a third calibration step, the first lens system of the second optical group of the second side is focused on a second alignment mark. The lens system is preferably calibrated such that the alignment mark is located in the centre of the depth of field.

In a fourth calibration step, the second lens system of the second optical group of the second side is focused on the same, second alignment mark. The lens system is preferably calibrated such that the alignment mark is located in the centre of the depth of field.

The optical axes of both second lens systems do not generally lie normal to the focusing plane. The optical axes thus preferably intersect in the second alignment mark. After this calibration step, the two lens systems of the second optical group are no longer moved with respect to one another.

It is also conceivable to use a calibration substrate which has only one alignment mark, which then has to be displaced between the calibration steps of the first side and the calibration steps of the second side. During the translational displacement of the calibration substrate, the alignment mark must maintain as constant a z-position as possible, especially on the assumption of a flat substrate. Generally, the z-spacings with respect to the substrate surface must be constant in all positions of the substrate. If for example the substrate is curved, a post-correction of the lens systems and/or the substrate in the z-direction should preferably take place when there is a translational displacement of the substrate relative to the lens systems. In the case of negligible curvatures, such corrections can be dispensed with. Following the calibration, the focusing plane is located within the depth of field of all four lens systems. The focusing plane and the subsequent bonding plane preferably coincide. Once a calibration of the lens systems has been carried out, the actual process according to the invention can start. The calibration process can be found in WO2014202106A1.

The resolution of the lens systems lies between 10,000 nm and 10 nm, preferably between 5000 nm and 50 nm, still more preferably between 1000 nm and 100 nm, most preferably between 750 nm and 380 nm.

The resolution is preferably defined according to the Rayleigh criterion.

For the sake of completeness, it is disclosed that the method according to the invention also functions with alignment systems wherein the lens systems of one side are not mechanically coupled with one another in a optical group. Such an alignment system is mentioned for example in publication WO2011042093A1. In such an alignment system, an upper and a lower lens system do not necessarily have to be positioned opposite one another, but can also be spaced apart from one another in the x-y plane. Such an alignment system can however also be used to carry out the process according to the invention.

Measurement Process

A plurality of systems with different alignment concepts exist in the prior art. The systems most relevant for the invention are disclosed in publications U.S. Pat. No. 6,214,692B1 and WO2014202106A1.

Publication U.S. Pat. No. 6,214,692B describes a system wherein the substrates are mutually shifted between the lens systems, which are located in front of or behind the substrate stack.

Publication WO2014202106A1, on the other hand, describes a system wherein the substrates are mutually shifted between lens systems which are located at the side of the substrate stack. The disclosed, improved alignment process according to the invention can be applied to all the aforementioned alignment systems, but in particular also to WO2014202106A1. The disclosed, improved alignment process according to the invention, however, is presented by way of example on the basis of the disclosed alignment system in patent specification U.S. Pat. No. 6,214,692B1.

The method according to the invention can in principle be applied to all known alignment methods and can be carried out by almost all alignment systems.

The substrates to be aligned with respect to one another are fixed on sample holders. The sample holders comprise fixings. The fixings serve to hold the substrates firm. The fixings can be
- mechanical fixings, in particular
  - clamps
- vacuum fixings, in particular with
  - individually controllable vacuum tracks
  - vacuum tracks connected to one another
  - as part of a pin substrate holder (pin chuck see for example WO2015113641A1)
- electrical fixings, in particular
  - electrostatic fixings
- magnetic fixings
- adhesive fixings, in particular
  - Gel-Pak fixings
  - fixings with adhesive, in particular controllable surfaces The fixings are in particular electronically controllable. The vacuum fixing is the preferred type of fixing. The vacuum fixing preferably comprises a plurality of vacuum tracks, which emerge at the surface of the sample holder. The vacuum tracks are preferably individually controllable. In a technically more feasible application, several vacuum tracks are united to form vacuum track segments, which are individually controllable, and can therefore be evacuated and flooded individually. Each vacuum segment is however independent of the other vacuum segments. The possibility of setting up individually controllable vacuum segments is thus obtained. The vacuum segments are preferably designed annular. A targeted, radially symmetrical fixing and/or release of a substrate from the sample holder, which in particular is performed from the inside outwards, is thus enabled. In a much preferred embodiment, the sample holder is constituted as a pin sample holder (pin chuck). This is a sample holder wherein many, in particular symmetrically arranged, elevations, in particular pins, have been produced from the surface, the surroundings whereof can be evacuated. The substrate lies only on the heads of the elevations. The contact area is correspondingly small. An embodiment of a pin sample holder is disclosed in publication WO2015113641A1.

In the subsequent course of the embodiment according to the invention, a displacement of the lens systems from the inner to the outer alignment marks is described. The process according to the invention, however, also functions when the alignment marks are measured from the outside inwards, or even in an arbitrary sequence. The measurement of the alignment marks from the inside outwards on the first substrate surface side and a measurement of the alignment marks from the outside inwards on the second substrate surface side is conceivable, even if not preferred.

A further conceivable and preferred course of the embodiment according to the invention includes locating a plurality of alignment marks in the field of view of a lens system per substrate surface side, so that a displacement of the lens systems outwards or inwards is not necessary at all. According to the invention, it is thus even possible to measure a plurality of alignment marks without having to displace the optical groups.

In a much more preferred embodiment according to the invention, not only a plurality of alignment marks per substrate surface side are located in the field of view of the lens system, but are even nested into one another, without touching one another. A particularly efficient accommodation of a plurality of alignment marks per unit area is thus feasible. According to the invention, therefore, it is thus possible, in a particularly efficient manner, to measure a plurality of alignment marks without having to displace the optical groups.

In a first process step according to the invention, the measurement of the lower, inner alignment marks of the lower substrate takes place. For this purpose, the upper substrate is displaced, if need be, out of the field of view of the upper lens systems, so that the upper lens systems have a free view onto the lower, inner alignment marks of the lower substrate. The lower, inner alignment marks are preferably already located in the field of view of the upper lens systems, so that the optical groups do not have to be displaced. Displacement of the individual lens systems is no longer desired at this time. From now on, only the optical groups are displaced. Once the lower, inner alignment marks have been measured, there is a unique assignment between the lower sample holder position and the lower, inner alignment marks.

In a second process step according to the invention, the upper sample holder with the upper substrate is displaced over the lower substrate. The lower sample holder with the lower substrate is moved back, in particular simultaneously. A so-called position error correction (PEC) preferably takes place. This is understood to mean the measurement of the position of the lower sample holder by means of measuring devices, in particular by interferometers and/or other special lens systems, which are referred to below as PEC lens systems. The position error correction is necessary, since the lower substrate, during its movement out of the field of view of the upper lens systems, cannot be observed by the latter, since the upper substrate has generally already been displaced into its field of view. In order to be able to displace the lower substrate back into its original position with a high degree of precision in subsequent process steps, the position must be measured exactly during the movement out of the field of view of the lens systems. Interferometers are preferably used for the continuous measurement of the position of the lower sample holder. Still more preferably, use is made of additional lens systems, PEC lens systems, which are wholly independent of the aforementioned lens systems for detecting the alignment marks. These PEC lens systems measure markings on the lower sample holder and can thus indicate the position of the sample holder, in particular at all times. The position of the lower sample holder is preferably measured at least before the translational displacement. It can thus be ensured that the position can be restored at any time. As a result of the sample holder positions thus measured, the lower sample holder, and therefore the lower substrate, can be brought back into its original position at any time.

The accuracy with which the position detection of the sample holder is carried out for the position error correction is better than 1 m, preferably better than 500 nm, still more preferably better than 100 nm, most preferably better than 50 nm, with utmost preference better than 10 nm.

In a third process step according to the invention, the measurement of the upper, inner alignment marks of the upper substrate takes place. The upper, inner alignment marks are preferably already located in the field of view of the lower lens systems, so that the optical groups do not have to be displaced. The displacement of the individual lens systems is no longer permitted at this time. Once the upper, inner alignment marks have been measured, there is a unique assignment between the upper sample holder position and the upper, inner alignment marks. In particular, the upper sample holder is fixed in a further process.

In a fourth process step according to the invention, a movement of the optical groups takes place such that the upper, outer alignment marks are located in the field of view of the lower lens systems. Once the upper, outer alignment marks have been measured, there is a unique assignment between the upper sample holder position and the upper, outer alignment marks. In order not to lose the reference to the previously detected upper, outer alignment marks, the position of the lower lens systems is preferably monitored precisely here, preferably with optical measuring means, still more preferably by means of interferometry. The path travelled by the lens systems can thus be detected.

In a fifth process step according to the invention, the positioning of the lower substrate takes place. The two positions measured in the process step from the position error correction are used in order to position the lower substrate correctly again in its original position.

The upper substrate is displaced out of the field of view of the upper lens systems, in particular simultaneously.

In a sixth process step according to the invention, a movement of the optical groups takes place, so that the lower, outer alignment marks are located in the field of view of the upper lens systems. Once the lower, outer alignment marks have been measured, there is a unique assignment between the lower sample holder position and the lower, outer alignment marks. In order not to lose the reference to the previously detected lower, outer alignment marks, the position of the upper lens systems is preferably monitored precisely here, preferably with optical measuring means, still more preferably by means of interferometry. The path covered by the lens systems can thus be detected.

According to the invention, the positions of the upper and lower, outer and inner alignment marks exist at this time. The process according to the invention can be carried out on further alignment marks. In this case, the number of data available for the statistics and error correction is increased. The number of alignment marks per substrate surface side can generally be of arbitrary size. The number of the alignment marks per substrate surface side is greater than 1, preferably greater than 2, still more preferably greater than 5, most preferably greater than 10, with utmost preference greater than 20.

It is also conceivable to repeat the measurement at the alignment marks. As a result of a continuous exchange between inner and outer alignment marks, a statistical evaluation of the alignment positions and therefore a determination of a still more optimum, in particular imaginary alignment mark are possible.

In a further preferred embodiment, the optical groups no longer need to be moved at all after the calibration if at least two alignment marks per substrate surface side are located in the field of view of each lens system. Only steps one to three of the preceding process thus need to be carried out in order to measure at least two alignment marks per substrate surface side.

Calculation Process

Briefly, the calculation process is based on the fact that an error minimisation is carried out between the corresponding alignment marks of the upper side and lower side. The method of least squares is preferably used. The error minimisation leads to an ideal X-Y position and/or rotation position of the lower sample holder, as well as to an ideal X-Y position and/or rotation position of the upper sample holder, at which the substrates are aligned with one another in the optimum manner and can make contact with one another, in particular be bonded to one another, in a further process step.

Contacting Process/Bonding Process

The bonding of the two substrates to one another takes place following the calculation of the statistically averaged positions. The alignment of the substrates takes place relative to the statistically averaged positions. The substrates are displaced into the intended positions. An approach of the two substrates then takes place in the z-direction. A fusion bond, more preferably a hybrid bond, is in particular carried out. In the case of a fusion bond, the upper substrate in particular is curved by a pin into a convex shape, as viewed from the bond interface. The curved substrate makes contact with the second, in particular flat substrate, preferably centrically.

The alignment and bonding process can be carried out with a reproducibility between 150-250 nm, preferably between 125-225 nm, still more preferably between 100-200 nm, most preferably between 75-150 nm, with utmost preference between 50-100 nm.

Further advantages, features and details of the invention emerge from the following description of preferred examples of embodiment and on the basis of the drawings.

BRIEF DESCRIPTION OF THE DRAWINGS

FIG. 1a shows a diagrammatic plan view, not true to scale, of an ideal alignment mark in the field of view, FIG. 1b shows a diagrammatic plan view, not true to scale, of a plurality of ideal alignment marks in the field of view, FIG. 1c shows a diagrammatic plan view, not true to scale, of a plurality of ideal alignment marks aligned centred in the field of view.

FIG. 2 shows a diagrammatic plan view, not true to scale, of a non-ideal alignment mark, FIG. 3 shows a diagrammatic plan view, not true to scale, of a superposition of an ideal alignment mark with a non-ideal alignment mark.

In the figures, identical components or components with the same function are denoted by the same reference numbers.

DETAILED DESCRIPTION OF THE INVENTION

Figure 4:
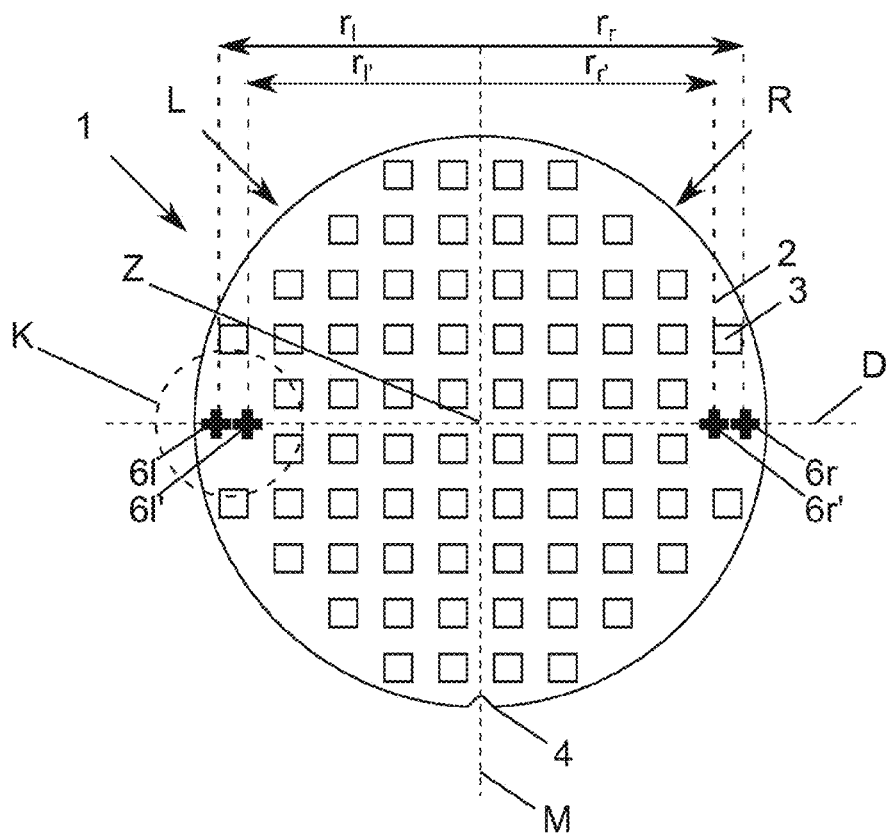
FIG. 4 shows a diagrammatic plan view, not true to scale, of a first substrate type with a notch.

The following nomenclature applies in the following descriptions of the figures. Elements of the left-hand substrate side are indicated with a lowercase 1. Elements of the right-hand substrate side are indicated with a lowercase r. Elements of the upper side are indicated with a lowercase o. Elements of the lower side are indicated with a lowercase u.

FIG. 1a shows a diagrammatic representation, not true to scale, of an individual, ideal alignment mark $6i$ in a field of view 10 of a lens system. Alignment mark $6i$ has straight edges $8i$, is picked up in particular in a telecentric manner, has as good a contrast as possible with respect to the surroundings, is symmetrical and in particular not distorted. An alignment mark $6i$ with such a high quality can only be produced with difficulty. Software would calculate an ideal centric position $7i$ from ideal alignment mark $6i$.

FIG. 1b shows a diagrammatic representation, not true to scale, of two ideal alignment marks $6i$, $6i'$ in a field of view 10. Alignment marks $6i$ and $6i'$ are small enough and close enough to one another such that they are simultaneously located in field of view 10 of an observing lens system $11ol$, $11or$, $11ul$, $11ur$. According to the invention, it is thus possible to avoid a displacement of the optical group between the two alignment marks $6i$ and $6i'$. The two alignment marks $6i$ and $6i'$ can however be measured simultaneously. Alignment marks $6i$ and $6i'$ have straight edges $8i$ and $8i'$, are in particular picked up in a telecentric manner, have as good a contrast as possible with respect to the surroundings, are symmetrical and in particular not distorted. Alignment marks $6i$ and $6i'$ with such a high quality can only be produced with difficulty. Software would calculate two ideal centric positions $7i$ and $7i'$ from ideal alignment marks $6i$ and $6i'$.

FIG. 1c shows a diagrammatic representation, not true to scale, of two ideal alignment marks $6i$, $6i'$ in a field of view 10. Alignment marks $6i$ and $6i'$ are in particular designed such that they are nested into one another, but do not touch one another. The two alignment marks $6i$ and $6i'$ are simultaneously located in field of view 10 of an observing lens system $11ol$, $11or$, $11ul$, $11ur$. According to the invention, it is thus possible to avoid a displacement of the optical group between the two alignment marks $6i$ and $6i'$. The two alignment marks $6i$ and $6i'$ can however be measured simultaneously. Alignment marks $6i$ and $6i'$ have straight edges $8i$ and $8i'$, are picked up in particular in a telecentric manner, have as good a contrast as possible with respect to the surroundings, are symmetrical and in particular not distorted. Alignment marks $6i$ and $6i'$ with such a high quality can only be produced with difficulty. Software would calculate two ideal centric positions $7i$ and $7i'$ from ideal alignment marks $6i$ and $6i'$.

The representation of analogous FIGS. 2b, 2c, 3b and 3c for non-ideal alignment marks 6 will be dispensed with below. The person skilled in the art understands that the observations concerning ideal alignment marks $6i$, $6i'$ can be transferred to non-ideal alignment marks 6.

FIG. 2 shows a diagrammatic representation, not true to scale, of a non-ideal alignment mark 6. The divergences from the desired, ideal form are shown exaggerated in order to facilitate the representation. A non-ideal alignment mark 6 generally has non-ideal, non-straight edges 8. Furthermore, non-ideal alignment mark 6 may be distorted or not picked up telecentrically, which can lead to an indistinct contrast of non-ideal, non-straight edges 8. Software would calculate a non-ideal centric position 7 from non-ideal alignment mark 6. By analogy with FIG. 1*b*, two small alignment marks 6, 6' lying close beside one another in a field of view 10 are also conceivable. By analogy with FIG. 1*c*, two alignment marks 6, 6' complementary to one another in a field of view 10 are conceivable.

FIG. 3 shows a diagrammatic representation, not true to scale, of a superposition of an ideal alignment mark 6*i* and a non-ideal alignment mark 6. Centric positions 7, 7*i* of alignment marks 6, 6*i* calculated by means of software are represented in the centre of respective alignment marks 6, 6'. Non-ideal centric position 7 diverges from desired, ideal centric position 7*i*. This error is due to the non-ideal features of non-ideal alignment mark 6, in particular non-ideal, non-straight edges 8, and produces an error which is to be compensated for as far as possible by the process according to the invention. The analogy considerations with respect to FIGS. 1*b* and 1*c* also apply here.

FIG. 4 shows a first substrate type 1, comprising a substrate 2 with a plurality of, in particular symmetrically produced, functional units 3. First substrate type 1 comprises a notch 4. As a result of the symmetrical arrangement of functional units 3, a symmetrical arrangement of alignment marks 6*l*, 6*l'*, 6*r* and 6*r'* suggests itself, but is not absolutely essential. Substrate type 1 is thus preferably divided by a plane, in particular a plane of symmetry, M into a left-hand region L and a right-hand region R. According to the invention, at least two alignment marks 6*l* and 6*l'* are located in left-hand region L and at least two alignment marks 6*r* and 6*r'* are located in the right-hand region. Alignment marks 6*l*, 6*l'*, 6*r* and 6*r'* are located at distances rl, rl', rr and rr' from centre Z of substrate 2. Alignment marks 6*l*, 6*l'*, 6*r* and 6*r'* are preferably located on a diameter line D.

Figure 5:
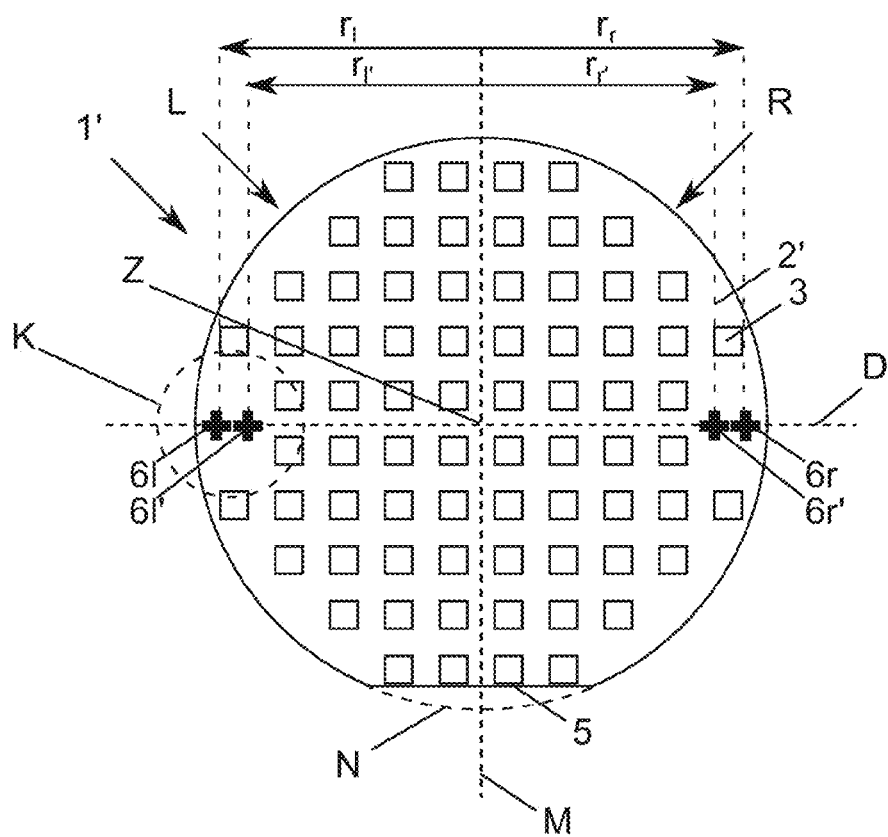
FIG. 5 shows a diagrammatic plan view, not true to scale, of a second substrate type with a flat side.

FIG. 5 shows a second substrate type 1', comprising a substrate 2' with a plurality of, in particular symmetrically produced, functional units 3. Second substrate type 1' comprises a flat side 5. As a result of the symmetrical arrangement of functional units 3, a symmetrical arrangement of alignment marks 6*l*, 6*l'*, 6*r* and 6*r'* suggests itself, but is not absolutely essential. Substrate type 1 is thus preferably divided by a plane, in particular a plane of symmetry. M into a left-hand region L and a right-hand region R. According to the invention, at least two alignment marks 6*l* and 6*l'* are located in left-hand region L and at least two alignment marks 6*r* and 6*r'* are located in the right-hand region. Alignment marks 6*l*, 6*l'*, 6*r* and 6*r'* are located at distances rl, rl', rr and rr' from centre Z of substrate 2'. Alignment marks 6*l*, 6*l'*, 6*r* and 6*r'* are preferably located on a diameter line D.

Figure 6:
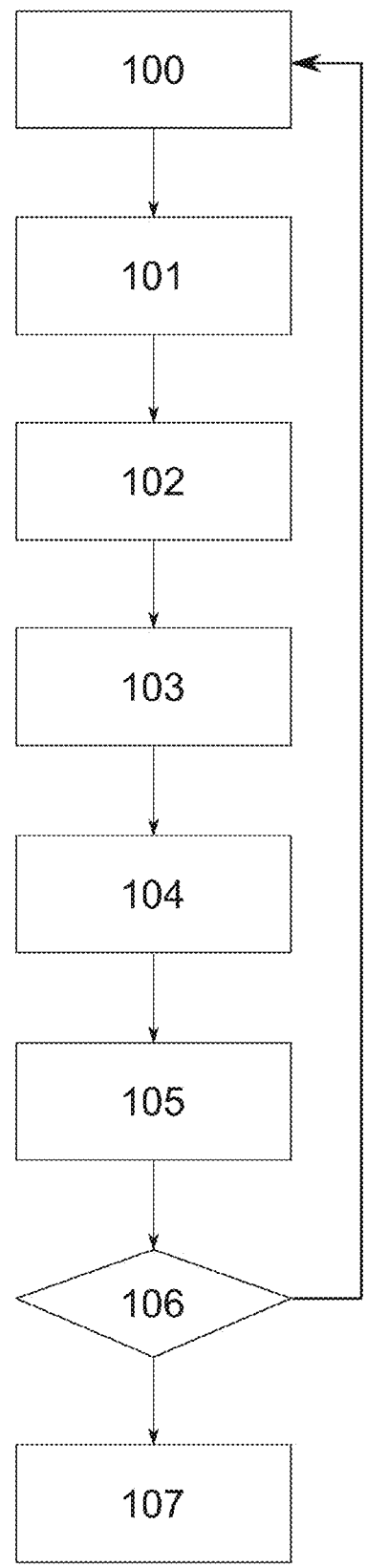
FIG. 6 shows a representation of a process flow according to the invention.

FIG. 6 shows a diagrammatic process flow of the process according to the invention. In a first process step 100, the measurement of lower, inner alignment marks 6*ul*, 6*ur* of lower substrate 2*u* takes place. In a further, second process step 101 according to the invention, the position error correction of lower sample holder 12*u* takes place. In a further, third process step 102 according to the invention, the measurement of upper, inner alignment marks 6*ol*, 6*or* of upper substrate 20 takes place. In a further, fourth process step 103 according to the invention, the measurement of upper, outer alignment marks 6*ol'*, 6*or'* of upper substrate 20 takes place. In a further, fifth process step 104 according to the invention, an exchange of sample holders 12*u*, 12*o* takes place. In a further, sixth process step 105 according to the invention, the measurement of lower, outer alignment marks 6*ul'*, 6*ur'* takes place. In a seventh process step 106 according to the invention, a decision is made as to whether further alignment marks are to be measured according to the same process sequence, or whether the measured alignment marks are to be measured again. In a last, eighth process step 107 according to the invention, the alignment and the bonding of the two substrate 2*u*, 2*o* then takes place.

Figure 7A:
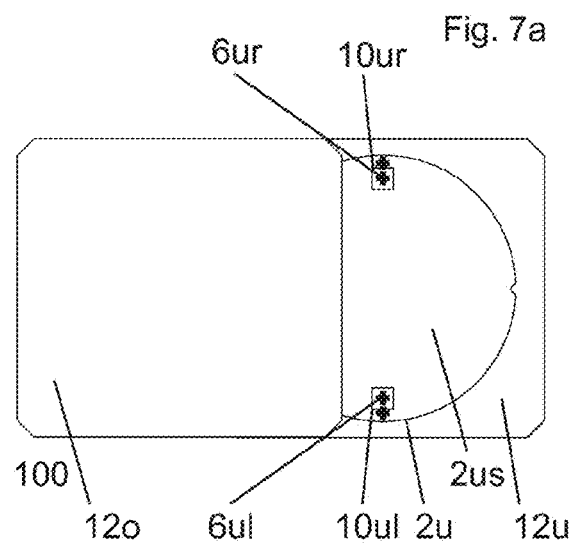
FIG. 7a shows a diagrammatic plan view, not true to scale, of a first process step according to the invention.
Figure 7B:
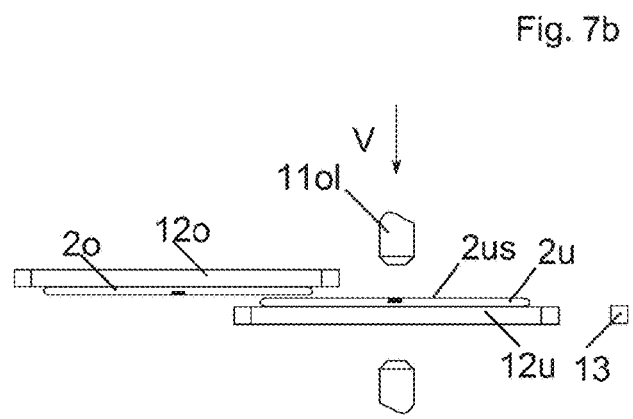
FIG. 7b shows a diagrammatic side view, not true to scale, of a first process step according to the invention.

FIG. 7*a* and FIG. 7*b* show a diagrammatic plan view and respectively a side view of a first process step 100 according to the invention, wherein a first, lower substrate 2*u* is fixed with a substrate surface 2*us* (s=surface) on a first, lower sample holder 12*u*. Second, upper sample holder 12*o*, on which second upper substrate 20*o* is fixed, is located in first process step 100 according to the invention so far from lower, inner alignment marks 6*ul* and 6*ur* in a waiting position, that upper left-hand lens system 10*ol* and upper right-hand lens system 10*or* (concealed in the side view) have free fields of view 10*ul* and 10*ur* onto the two lower, inner alignment marks 6*ul* and 6*ur*. In this alignment step according to the invention, a first storage of the positions of lower, inner alignment marks 6*ul* and 6*ur*, as well as the position of sample holder 12*u* in the measurement position for lower substrate 2*u* takes place.

Figure 8A:
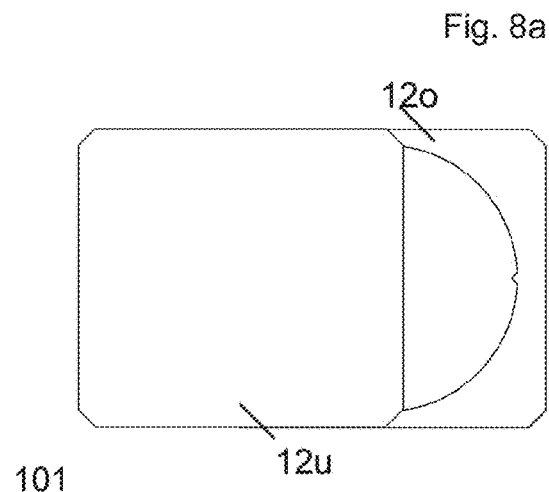
FIG. 8a shows a diagrammatic view from below, not true to scale, of a second process step according to the invention.
Figure 8B:
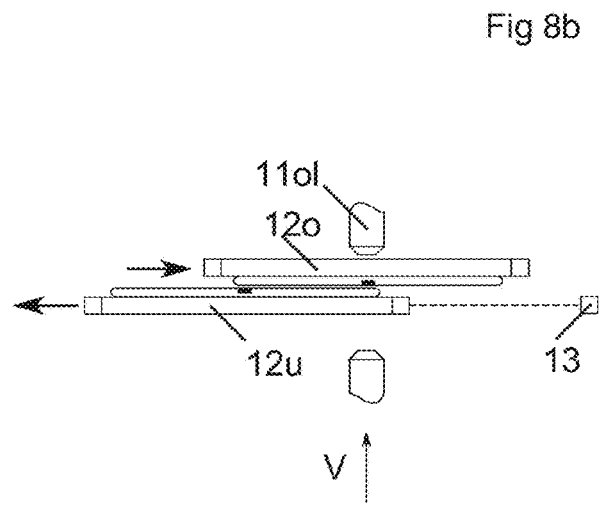
FIG. 8b shows a diagrammatic side view, not true to scale, of a second process step according to the invention.

FIG. 8*a* and FIG. 8*b* show a diagrammatic view from below and respectively a side view of a second process step 101 according to the invention, wherein second upper substrate holder 12*o* is moved into the measurement position for upper alignment marks 6*ol*, 6*or*. Lower sample holder 12*u* is displaced into its waiting position, in particular simultaneously. During the displacement, continuous monitoring and/or storage and/or measurement and/or correction of lower sample holder 12*u* can be carried out, in order that the position of alignment marks 6*ul* and 6*ur* measured previously with high precision can subsequently be found again exactly. This position error correction takes place by means of a PEC measuring system 13, in particular an interferometer. In still more preferred embodiments, the position error correction takes place by means of additional PEC lens systems, which however are located beneath sample holder 12*u*. Such PEC lens systems have not been shown for the sake of clarity.

Figure 9A:
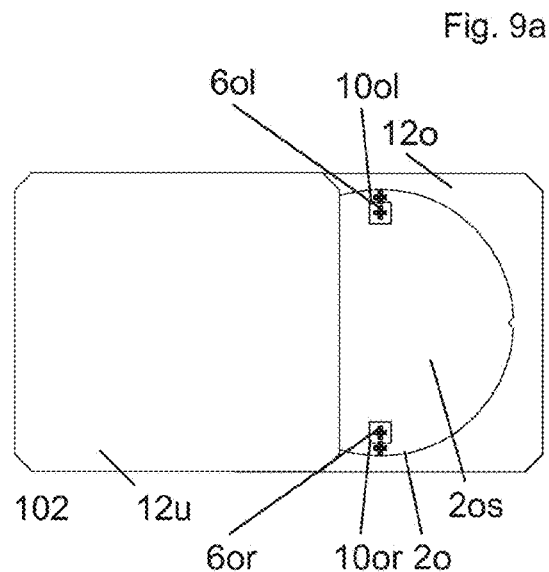
FIG. 9a shows a diagrammatic view from below, not true to scale, of a third process step according to the invention.
Figure 9B:
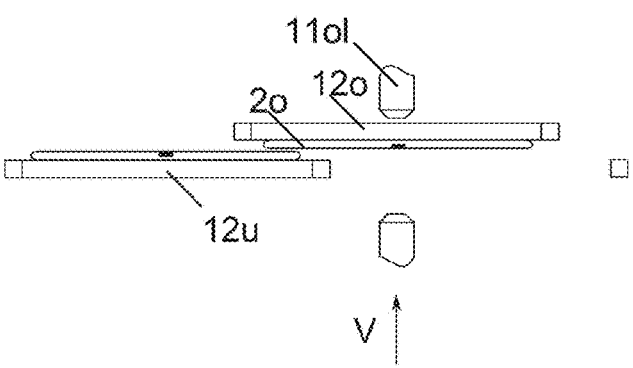
FIG. 9b shows a diagrammatic side view, not true to scale, of a third process step according to the invention.

FIG. 9*a* and FIG. 9*b* show a diagrammatic view from below and a side view of a third process step 102 according to the invention, wherein a measurement of upper, inner alignment marks 6*ol* and 6*or* take place. It can be seen that upper, left-hand alignment mark 6*ol* is located at the upper side in the view from below of FIG. 9*a*, whereas lower, left-hand alignment mark 6*ul* in the plan view of FIG. 7*a* is represented at the lower side. In this alignment step according to the invention, a storage of the positions of upper, inner alignment marks 6*ol* and 6*or*, as well as the position of upper sample holder 12*o* in the measurement position for upper substrate 2*o* takes place.

Figure 10A:
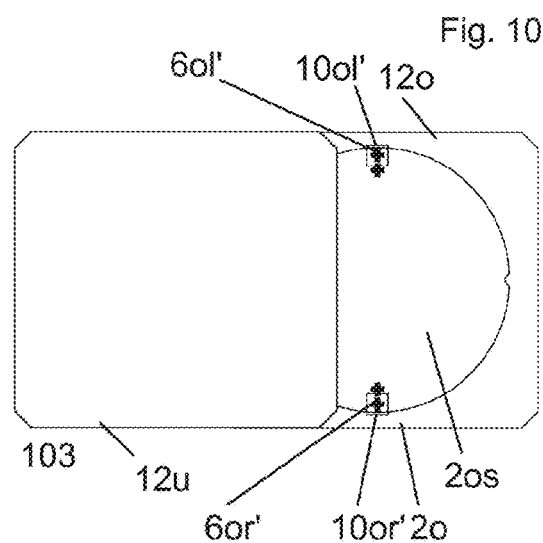
FIG. 10a shows a diagrammatic view from below, not true to scale, of a fourth process step according to the invention.
Figure 10B:
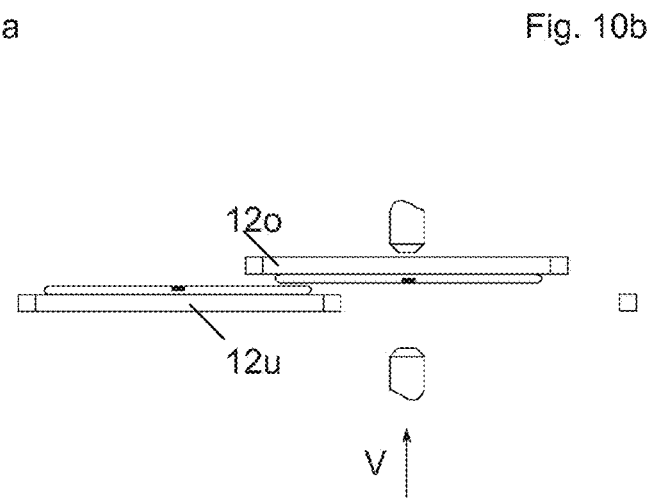
FIG. 10b shows a diagrammatic side view, not true to scale, of a fourth process step according to the invention.

FIG. 10*a* and FIG. 10*b* shows a diagrammatic view from below and respectively a side view of a fourth process step 103 according to the invention, wherein a measurement of upper, outer alignment marks 6*ol'* and 6*or'* takes place. In this alignment step according to the invention, a storage of the positions of upper, outer alignment marks 6*ol'* and 6*or'* takes place. If the storage of the position of upper sample holder 12*o* in the measurement position for upper substrate 2*o* has not yet taken place, it can still be done in this process step.

Figure 11A:
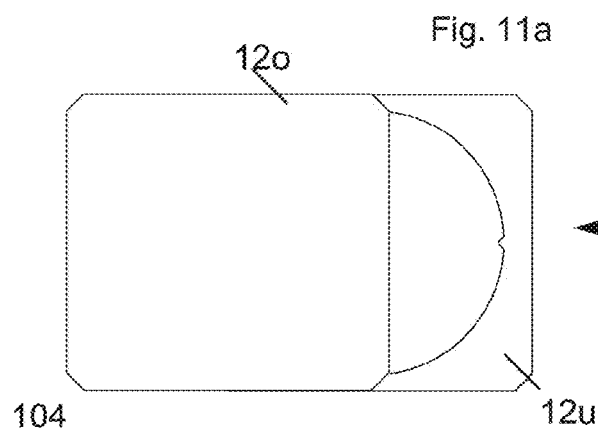
FIG. 11a shows a diagrammatic plan view, not true to scale, of a fifth process step according to the invention.
Figure 11B:
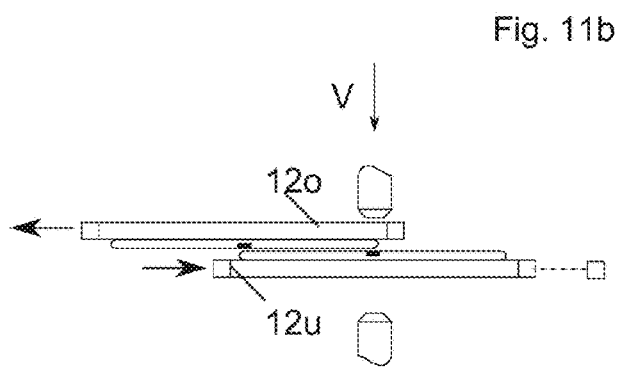
FIG. 11b shows a diagrammatic side view, not true to scale, of a fifth process step according to the invention.

FIG. 11a and figure lib show a diagrammatic plan view and respectively a side view of a fifth process step 104 according to the invention, wherein an exchange of sample holders 12o, 12u takes place. Lower sample holder 12u is moved, in particular with the aid of the data from the position error correction from second process step 101, back into its original position. A displacement of upper sample holder 12o into the waiting position takes place in particular simultaneously.

Figure 12A:
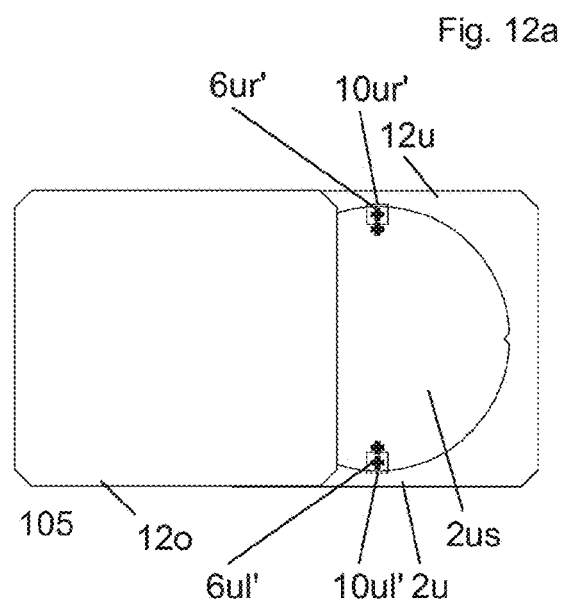
FIG. 12a shows a diagrammatic plan view, not true to scale, of a sixth process step according to the invention.
Figure 12B:
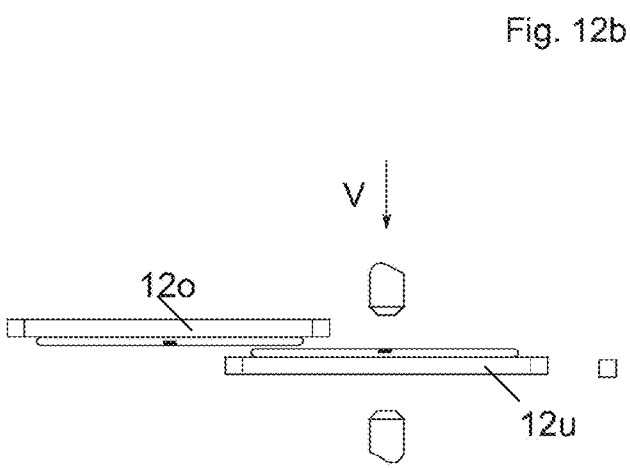
FIG. 12b shows a diagrammatic side view, not true to scale, of a sixth process step according to the invention.
Figure 13:
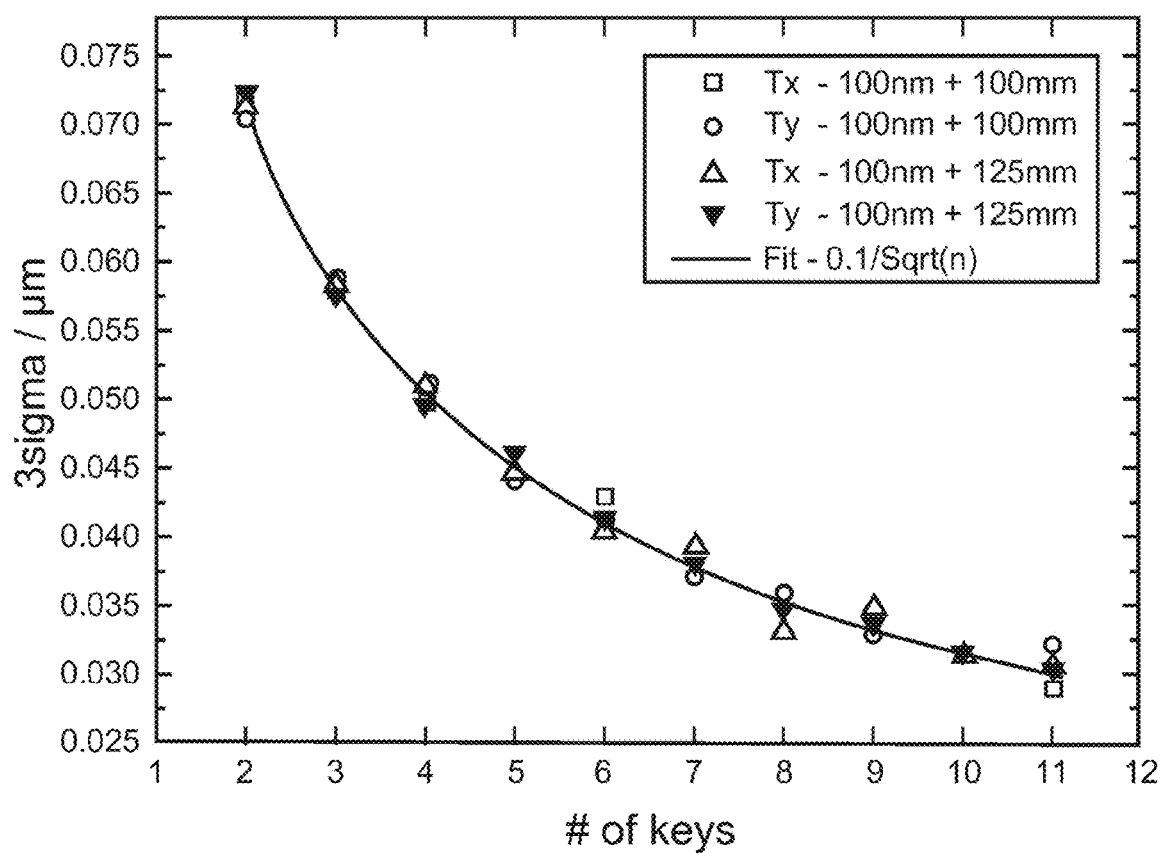
FIG. 13 shows a graphic representation of the reduction of the alignment error as a function of the number of measured alignment marks.

FIG. 12a and FIG. 12b show a diagrammatic plan view and a side view of a sixth process step 105 according to the invention, wherein a measurement of lower, outer alignment marks 6ul' and 6ur' takes place. In this alignment step according to the invention, a storage of the positions of lower, outer alignment marks 6ul' and 6ur' takes place.

FIG. 15 shows a diagram, which represents the 3 sigma value of the alignment error as a function of the number of measured alignment marks 6. With an increasing number of alignment marks, the 3 sigma value of the alignment error falls inversely proportional to the root of the alignment marks used.

REFERENCE LIST 1,1' substrate type
2, 2', 2u, 2o substrate
2us, 2os substrate surface
3 functional unit
4 notch
flat side
6, 6i, 6', 6i', 6l, 6', 6r, 6r',
6ul, 6ul', 6ur, 6ur', 6ol, 6ol'.
6or, 6or' alignment marks
7i, 7, 7i', 7' centric position
8i, 8, 8i', 8' edges
9, 9' statistically averaged position
10, 10ul, 10ur, 10ol, 10or,
10ul', 10ur', 10ol', 10or' fields of view
11ol, 11or, 11ul, 11ur lens systems
12u, 12o sample holder
13 PEC measuring system
rl, rl', rr, rr' radii
M planes, in particular planes of symmetry
L1, L2, L3 lines
h point of intersection
L left-hand region
R right-hand region
Z centre
D diameter line
N widened circle

What is claimed is:

1. A method for aligning a first substrate with a second substrate, the first substrate to be bonded with the second substrate, wherein the first substrate comprises a first substrate surface with a first substrate surface side and a second substrate surface side which lies opposite the first substrate surface side, wherein the second substrate comprises a second substrate surface to be bonded with the first substrate surface, wherein the second substrate surface comprises a third substrate surface side and a fourth substrate surface side which lies opposite the third substrate surface side, said method comprising:

detecting and storing first positions of a first alignment mark pair on the first substrate surface of the first substrate, wherein a first alignment mark of the first alignment mark pair is arranged on the first substrate surface side and a second alignment mark of the first alignment mark pair is arranged on the second substrate surface side, detecting and storing second positions of a second alignment mark pair on the second substrate surface of the second substrate, wherein a third alignment mark of the second alignment mark pair is arranged on the third substrate surface side and a fourth alignment mark of the second alignment mark pair is arranged on the fourth substrate surface side, detecting and storing third positions of a third alignment mark pair on the second substrate surface of the second substrate, wherein a fifth alignment mark of the third alignment mark pair is arranged on the third substrate surface side and a sixth alignment mark of the third alignment mark pair is arranged on the fourth substrate surface side, detecting and storing fourth positions of a fourth alignment mark pair on the first substrate, wherein a seventh alignment mark of the fourth alignment mark pair is arranged on the first substrate surface side and an eighth alignment mark of the fourth alignment mark pair is arranged on the second substrate surface side, aligning the first and second substrates with respect to each other depending on the detected first positions, second positions, third positions, and fourth positions.

2. The method according to claim 1, wherein the method includes:

arranging and fixing the first and second substrates on first and second substrate holders, moving the first substrate holder with the first substrate into a first detection position, detecting and storing the first positions of the first alignment mark pair on the first substrate surface of the first substrate in the first detection position, wherein the first alignment mark of the first alignment mark pair is arranged on the first substrate surface side and the second alignment mark of the first alignment mark pair is arranged on the second substrate surface side, moving the second substrate holder with the second substrate into a second detection position and moving the first substrate holder with the first substrate into a first waiting position, detecting and storing second positions of the second alignment mark pair on the second substrate surface of the second substrate in the second detection position, wherein the third alignment mark of the second alignment mark pair is arranged on the third substrate surface side and the fourth alignment mark of the second alignment mark pair is arranged on the fourth substrate surface side, detecting and storing the third positions of the third alignment mark pair on the second substrate surface of the second substrate in the second detection position of the second substrate holder, wherein the fifth alignment mark of the third alignment mark pair is arranged on the third substrate surface side and the sixth alignment mark of the third alignment mark pair is arranged on the fourth substrate surface side, moving the first substrate holder with the first substrate into the first detection position and moving the second substrate holder with the second substrate into a second waiting position, detecting and storing the fourth positions of the fourth alignment mark pair on the first substrate in the first detection position, wherein the seventh alignment mark of the fourth alignment mark pair is arranged on the first substrate surface side and the eighth alignment mark of the fourth alignment mark pair is arranged on the second substrate surface side, aligning the first and second substrates with respect to each other depending on the detected first positions, second positions, third positions and fourth positions.

3. The method according to claim 1, wherein the method includes:

detecting the positions of at least two alignment marks per substrate surface side on the first and second substrates.

4. The method according to claim 1, wherein the alignment marks of a substrate surface side are arranged inside a circle K with a radius less than 100 mm.

5. The method according to claim 1, wherein the method includes:

optically detecting the positions of the alignment marks.

6. The method according to claim 2, wherein the positions of the first and second substrate holders are detected by interferometers and/or lens systems.

7. The method according to claim 2, wherein the first and second substrate holders are fixed in the detection positions.

8. A device for the alignment of a first substrate with a second substrate, the first substrate to be bonded with the second substrate, said device comprising:

first and second substrate holders for holding and fixing the first and second substrates, movement devices for moving the first and second substrate holders, lens systems for detecting positions of alignment marks on the first and second substrates, a storage device for storing the positions of the alignment marks detected by the lens system.

9. A product with first and second substrates, the first substrate comprising a first substrate surface with a first substrate surface side and a second substrate surface side which lies opposite the first substrate surface side, the second substrate comprising a second substrate surface with a third substrate surface side and a fourth substrate surface side which lies opposite the third substrate surface side, the second substrate surface bonded to the first substrate surface, said product comprising at least two alignment marks on each side of the first and second substrates.

10. The method according to claim 6, wherein the interferometers and/or lens system are independent of the detection devices for detecting the positions of the alignment marks.

11. The method according to claim 1, wherein the first alignment mark pair, the second alignment mark pair, the third alignment mark pair and the fourth alignment mark pair are distinct from one another.

* * * * *